United States Patent [19]

Takeda et al.

[11] 4,270,134
[45] May 26, 1981

[54] LIGHT-EMITTING SEMICONDUCTOR DEVICE

[75] Inventors: Yutaka Takeda, Ohme; Kunio Aiki; Ryoichi Ito, both of Hachioji, all of Japan

[73] Assignee: Hitachi, Ltd., Tokyo, Japan

[21] Appl. No.: 34,263

[22] Filed: Apr. 30, 1979

[30] Foreign Application Priority Data

Apr. 28, 1978 [JP] Japan .................................. 53-49829

[51] Int. Cl.³ ...................... H01L 31/12; H01L 33/00
[52] U.S. Cl. ........................................ 357/19; 357/17; 357/81; 357/18; 331/94.5 H
[58] Field of Search ....................... 357/19, 17, 81, 18; 331/94.5 H

[56] References Cited

U.S. PATENT DOCUMENTS

| | | | |
|---|---|---|---|
| 4,058,821 | 11/1977 | Miyoshi | 357/19 |
| 4,097,891 | 6/1978 | Selway | 357/81 |
| 4,100,562 | 7/1978 | Sugawara | 357/19 |

OTHER PUBLICATIONS

Crow, I.B.M. Tech. Discl. Bull., vol. 20, No. 5, Oct. 1977, pp. 2089-2090.

Primary Examiner—Martin H. Edlow
Attorney, Agent, or Firm—Craig & Antonelli

[57] ABSTRACT

A light-emitting semiconductor device is provided having a light-emitting semiconductor element emitting light in two directions. The light-emitting element is disposed in a housing so that one light-emitting face of the semiconductor element adjacent a heat sink, and a light guide is arranged to confront the other light-emitting face of the semiconductor element and to guide light from said other light-emitting face to the outside of the housing. In this device, the end face of the light guide confronting said other light-emitting face of the semiconductor element includes a face substantially inclined to the optical axis of light emitted from the semiconductor element.

10 Claims, 12 Drawing Figures

LIGHT-EMITTING SEMICONDUCTOR DEVICE

BACKGROUND OF THE INVENTION

(1) Field of the Invention

The present invention relates to a package of a light-emitting semiconductor element. More particularly, the invention relates to a package of a light-emitting semiconductor element emitting light in two directions, such as a semiconductor laser.

(2) Description of the Prior Art

When light emitted in one direction from a light-emitting semiconductor element such as a semiconductor laser is applied to such use as optical-communication, a window is formed on a package and light from the light-emitting semiconductor element in the package is emitted to the outside and utilized through a lens system. On the other hand, light emitted from the other face is often used for monitoring the light output of this light-emitting semiconductor element. This light output is taken out through, for example, an optical fiber or glass rod, or it is directly applied to a light-receiving element to take out the output in the form of an electric signal.

FIG. 1 is a mode diagram illustrating the section of a conventional package of a light-emitting semiconductor element. In FIG. 1, reference numerals 1, 2, 3, 4, 5, 6 and 7 represent a stem, a light guide rod, a light take-out window, a light-emitting semiconductor element, reflected light, emitted light and a fixing member for the light guide rod, respectively. The structure in which the end face of a light guide confronts to the light-emitting face of a light-emitting semiconductor element as shown in FIG. 1 is illustrated in, for example, the specification of U.S. Pat. No. 4,097,891.

In such conventional structure, if a light guide such as a glass rod 2 is employed for monitoring, laser light is reflected on the end face of the glass rod and is emitted on the opposite side, that is, in the front direction of the cleave face. As a result, the light taken out from the front directly or through the window is overlapped on this reflected light to form an interference pattern.

The non-uniformity of the light output based on such interference pattern induces a noise when the system is used in optical-communication. Further, when such a conventional package is applied to another use, for example, when it is used as a light source for writing or reading by applying laser light to a recording layer, the above non-uniformity causes errors.

The present invention has been completed as a result of research made with a view to eliminating the foregoing defects involved in the conventional technique.

SUMMARY OF THE INVENTION

In accordance with the present invention, there is provided a light-emitting semiconductor device comprising a light-emitting semiconductor element emitting light in two directions. The device is disposed in a housing so that one light-emitting face of said semiconductor element is located in the vicinity of one end face of a heat sink. A light guide is arranged to confront to the other light-emitting face of said semiconductor element to guide light from said other light-emitting face to the outside of the housing. The end face of the light guide confronting said other light-emitting face of said semiconductor element includes a face substantially inclined to the optical axis of light emitted from said semiconductor element.

DETAILED DESCRIPTION OF THE PREFERRED EMBODIMENTS

In the present invention, the end face of a light guide rod disposed in the vicinity of a light-emitting semiconductor element such as a semiconductor laser element is arranged to have a plane substantially inclined to the optical axis of light emitted from the semiconductor element.

The present invention will now be described by reference to embodiments illustrated in the accompanying drawings.

Figure 1:
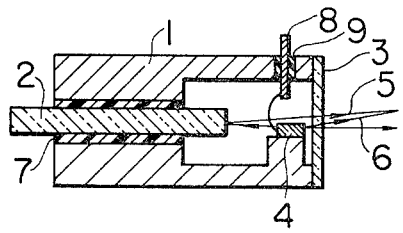
FIG. 1 is a sectional view illustrating a conventional package of a light-emitting semiconductor element.
Figure 2:
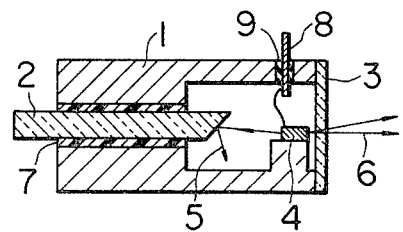
FIGS. 2 through 10 are sectional views illustrating embodiments of the structure of the present invention.

FIG. 2 is a sectional view illustrating one embodiment of the light-emitting semiconductor device according to the present invention. Reference numerals in FIG. 2 indicate the same members as in FIG. 1. A stem 1 is composed of a metallic material such as copper, Kovar or brass, and reference numeral 2 represents a light guide such as a glass rod, a quartz rod or an epoxy resin rod. A light take-out window 3 is formed of, for example, glass, quartz or resin. Reference numeral 4 represents a light-emitting semiconductor element emitting light in two directions, for example, a semiconductor laser element. Reference numeral 5 represents a light reflected on the end face of the light guide rod and reference numeral 6 represents light emitted from the light-emitting semiconductor element. A member 7 for fixing the glass rod or the like is composed of a known adhesive such as an epoxy type adhesive. In the present invention, electrodes are taken out from the light-emitting semiconductor element according to customary procedures. For example, as in the embodiment shown in FIG. 2, a take-out electrode is inserted as one electrode 8 into the stem through an insulating material 9 such as glass and is bonded to the semiconductor element through a lead-in wire. When the metallic stem is used, it is utilized as the other electrode. Of course, in the present invention, the electrode take-out method is not limited to this method.

The light-emitting semiconductor element is placed on a desirable heat sink. In the embodiment illustrated in FIG. 2, a projection is formed on the copper stem 1 so that the projection acts as the heat sink. Of course, there may be adopted a modification in which a block as a heat sink is separately formed, the light-emitting semiconductor element 4 is placed on the separately formed heat sink and the heat sink is then fixed to the stem. In this case, the heat sink may be formed from a ceramic material. The light-emitting semiconductor element 4 is placed on the heat sink so that one light-emitting face of the semiconductor element is located in the vicinity of one end face of the heat sink. When the light-emitting face of the semiconductor element is withdrawn from the end face of the heat sink by 5 μm or more, the emitted light is reflected on the top face of the heat sink, and the emitted light is influenced by this reflected light there by significantly deteriorating operation. In this connection, the semiconductor element may be located so that said light-emitting face is slightly advanced over the end face of the heat sink. Other parts of the structure shown in FIG. 2 may be the same as in the conventional arrangement. For example, an epoxy type adhesive is used as the fixing member 7 for the light guide 2. Reference numeral 8 represents an electrode take-out portion of the light-emitting semiconductor element 4. In the embodiment shown in FIG. 2, the end face of the glass rod as the light guide is polished such that it is slanted relative to the light-emitting face of the seimconductor element.

The intended effects of the present invention can be attained by inclining the end face of the light guide, and it is preferred that the inclination angle of the end face to the optical axis of the laser beam be at least 1°. It is most preferred that the inclination angle of the end face be larger than ½ of the expansion angle of the laser beam flux and the light guide be disposed so that this inclined end face confronts the heat sink. If the vertical angle is too small, a strength of the glass rod as the light guide is reduced. Accordingly, a vertical angle of up to about 30° will be practical, and it is not necessary to select too small a vertical angle.

FIGS. 3 through 10 are sectional views illustrating other embodiments of the structure of the light-emitting semiconductor device of the present invention. In these figures, the relation between the light-emitting semiconductor element 4 and the light guide 2 is mainly illustrated, and structures of other members such as the stem 2 may be changed and modified in various manners.

Figure 3:
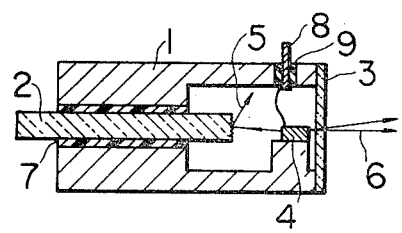

In the embodiment illustrated in FIG. 3, the end face of a glass rod, which is ordinarily a mirror face, is roughened to form fine convexities and concavities. Accordingly, diffused reflection takes place when the laser beam flux is applied. In short, in this embodiment, the end face of the light guide includes a face having convexities and concavities so that the face is inclined to the optical axis of the light emitted from the light-emitting semiconductor element. A polished face formed by using a polishing member having an average grain size of 3 to 100 μm is practical as the roughened end face. In the embodiment illustrated in FIG. 3, fine convexities and concavities are formed on the end face by polishing with an alumina polishing member having an average grain size of 13 μm.

When the maximum roughness (the difference between the highest point and the lowest point on the roughened face) is at least 1 μm, the intended effects of the present invention can be sufficiently attained. Ordinarily, the maximum roughness is adjusted between 1 to 3 μm.

Figure 4:
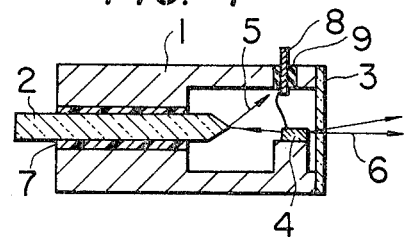

In the embodiment shown in FIG. 4, the top end of a glass rod is cut-polished to two inclined faces from the upper and lower parts.

Figure 5:
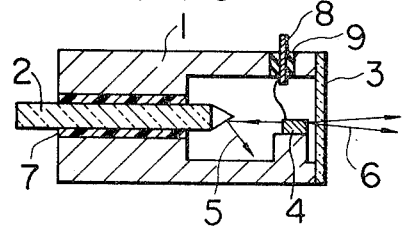

In the embodiment shown in FIG. 5, the top end of a glass rod is polished in the conical form.

Figure 6:
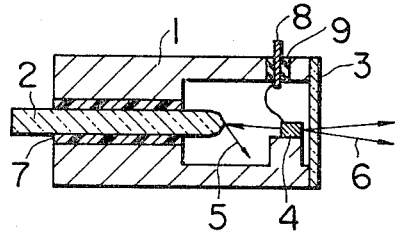

In the embodiment shown in FIG. 6, the end face of a glass rod is cut-polished in the polygonal form.

Figure 7:
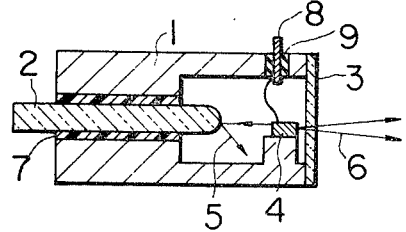

In the embodiment shown in FIG. 7, the top end of a glass rod is shaped in the semicylindrical form. Of course, the top end may be shaped in the semi-spherical form.

Figure 8:
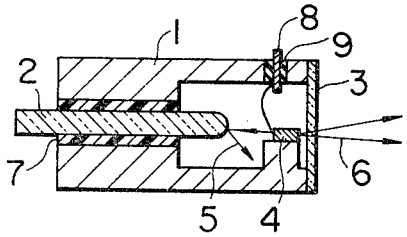

In the embodiment shown in FIG. 8, the top end of a glass rod is shaped in the form of a distorted sphere.

Figure 9:
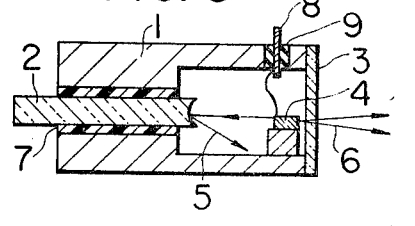

In the embodiment shown in FIG. 9, a concave face is formed on the top end of a glass rod. In each of the foregoing embodiments, the convex top end portion may be made concave as in the embodiment shown in FIG. 9. In the embodiment shown in FIG. 9, a copper block prepared separately from the stem is used as the heat sink.

Figure 10:
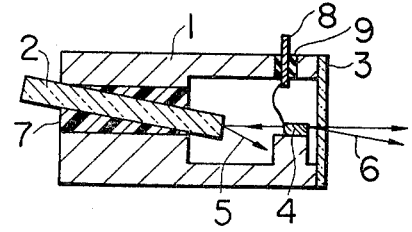

In the foregoing embodiments, the axis of the glass rod is in parallel to the optical axis of the laser beam. In the embodiment shown in FIG. 10, however, a glass rod is arranged so that its axis is inclined to the optical axis of the laser beam. In this embodiment, the end face of the glass rod per se is vertical to the axis of the glass rod, but effects substantially similar to those attained in the embodiment shown in FIG. 2 can be attained. When the glass rod is inclined as shown in FIG. 10, the end face of the glass rod may be processed in various shapes as shown in FIGS. 2 to 9.

Among various shapes of the end face of the light guide, illustrated hereinbefore, those shown in FIGS. 2 and 3 have a highest practical value. More specifically, it is practically preferred that a plane inclined to the optical axis of the laser beam be formed on the light guide as shown in FIG. 2 or a polished face having fine convexities and concavities be formed on the light guide as shown in FIG. 3, because the preparation is very easy and the manufacturing cost can be reduced.

Figure 11:
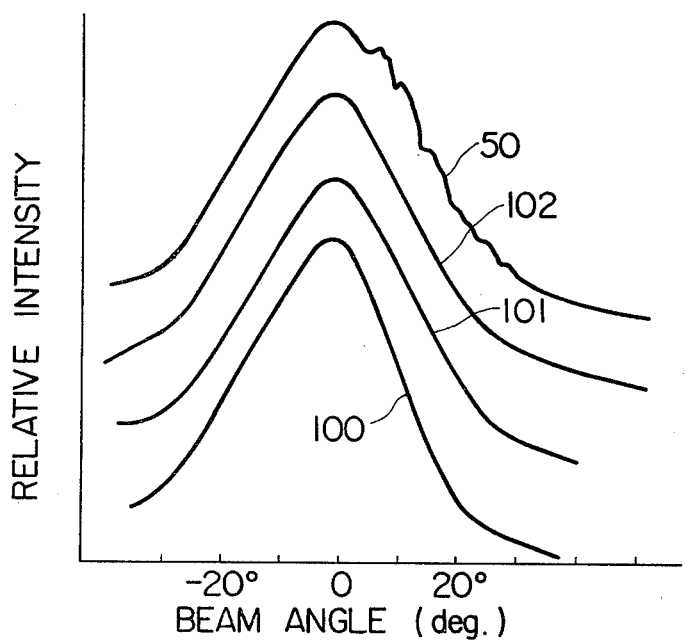
FIGS. 11 and 12 are diagrams illustrating patterns of light outputs from semiconductor lasers in various packages.
Figure 12:
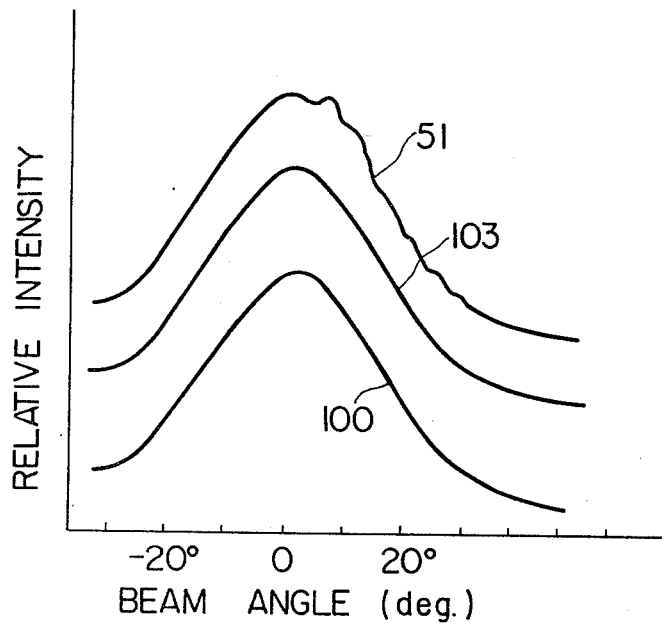

FIGS. 11 and 12 illustrate results of the measurement of the intensity of the laser beam in the direction vertical to the p-n junction of a semiconductor laser element, in which the abscissa indicates the beam angle and the ordinate indicates the relative intensity. Each curve shows the relative value of the intensity of the laser beam to the beam angle, but these curves are not to compare the intensities of the respective curves with one another.

Curve 100 of FIG. 11 shows the light output pattern observed when the laser beam is taken out to the outside only from one glass window and a glass rod or the like is not disposed. Curve 50 shows the light output pattern observed when a semiconductor laser is arranged in a package having a conventional structure as shown in FIG. 1. In this case, many disturbances are seen on the light output pattern as shown in FIG. 11. Curve 101 shows the light output pattern observed when a semiconductor laser is arranged in a package having a structure as shown in FIG. 2, and curve 102 shows the light output pattern observed when a semiconductor laser is arranged in a package having a structure as shown in FIG. 3. Each of patterns shown by curves 101 and 102 does not include any disturbance and is similar to the output pattern observed when the glass rod is not disposed in the structure.

FIG. 12 shows another instances of output patterns. Curve 100 shows the light output pattern observed when a glass rod or the like is not disposed as in the case of curve 100 of FIG. 11. Curve 51 shows the light output pattern observed when a semiconductor laser is arranged in a conventional package having a structure shown in FIG. 1 as in the case of curve 50 of FIG. 11. Curve 103 shows the light output pattern observed when the top end of the glass rod is shaped in the spherical form as shown in FIG. 7. In this case, no disturbance is observed in the output pattern, and it is seen that the effects of the present invention are sufficiently attained.

It has been confirmed that in each of the foregoing embodiments of the present invention, the intensity of the beam which has passed through the monitoring light guide is sufficiently high as the light output for monitoring.

As will readily be understood from the foregoing illustration, according to the present invention, there can be provided a light-emitting semiconductor device comprising a light guide for monitoring, in which disturbance of the light output can be effectively prevented by very simple means.

What is claimed is:

1. A light-emitting semiconductor device, comprising:
    a light-emitting semiconductor element capable of emitting light in two directions; and
    a housing for said light-emitting element, said housing including a heat sink for the semiconductor element, a monitoring light guide for receiving and transmitting light from said light-emitting element in one of said two directions therethrough, and a light take-out means for receiving and transmitting light from the light-emitting element out of the housing in the other of said two directions,
    wherein said monitoring light guide has a light-receiving face located adjacent said light-emitting element for receiving light therefrom in said one direction, at least part of which light-receiving face is substantially inclined in a direction relative to the optical axis of the light emitted in said one direction from said semiconductor element so that light reflected from the inclined part of said light-receiving face will be directed in a direction different than that of said other direction of light emitted by the light-emitting element so as not to interfere with said light emitted in said other direction.

2. A light-emitting semiconductor device, comprising:
    a light-emitting semiconductor element capable of emitting light in two directions; and
    a housing for said light-emitting element, said housing including a heat sink for the semiconductor element, a monitoring light guide for receiving and transmitting light from said light-emitting element in one of said two directions therethrough for monitoring the light output of the light-emitting element, and means for receiving and passing light emitted from the light-emitting element out of the housing in the other of said two directions,
    wherein said monitoring light guide has a light-receiving face located adjacent said light-emitting element for receiving light therefrom, at least part of which said light-receiving face is substantially inclined to the optical axis of the light emitted from said semiconductor element.

3. A light-emitting semiconductor device as set forth in claim 2 wherein the end face of said monitoring light guide confronting to said other light-emitting face of the semiconductor element has a plane substantially inclined to the optical axis of light emitted from said semiconductor element.

4. A light-emitting semiconductor device as set forth in claim 3 wherein the end face of said monitoring light guide confronting to said other light-emitting face of the semiconductor element has at least 2 planes inclined to the optical axis of light emitted from said semiconductor element.

5. A light-emitting semiconductor device as set forth in claim 4 wherein the end face of said monitoring light guide confronting to said other light-emitting face of the semiconductor element is wedge-shaped.

6. A light-emitting semiconductor device as set forth in claim 3 wherein the end face of said monitoring light guide confronting to said other light-emitting face of the semiconductor element has a concave portion including at least 2 planes inclined to the optical axis of light emitted from said semiconductor element.

7. A light-emitting semiconductor device as set forth in claim 2 or 2 wherein the end face of said monitoring light guide confronting to said other light-emitting face of the semiconductor element has fine convexities and concavities.

8. A light-emitting semiconductor device as set forth in claim 2 wherein the end face of said monitoring light guide confronting to said other light-emitting face of the semiconductor element includes a curved face.

9. A light-emitting semiconductor device as set forth in claim 8 wherein the end face of said monitoring light guide confronting to said other light-emitting face of the semiconductor element has a concave portion having a curved face.

10. A light-emitting semiconductor device as set forth in claim 2 wherein the monitoring light guide has a rod-like shape and is arranged in said packaging member slantwise to the optical axis of light emitted from said semiconductor element, and the end face of said monitoring light guide confronting to said other light-emitting face of the semiconductor element is inclined to the optical axis of light emitted from said semiconductor element.

* * * * *